United States Patent [19]
Ogawa et al.

[11] Patent Number: 5,815,044
[45] Date of Patent: Sep. 29, 1998

[54] VARIABLE-REACTANCE CIRCUIT

[75] Inventors: Atsusi Ogawa, Chigasaki; Tsuneyuki Murayama, Yokohama, both of Japan

[73] Assignee: Kabushiki Kaisha Toshiba, Kawasaki, Japan

[21] Appl. No.: 698,261

[22] Filed: Aug. 14, 1996

[30] Foreign Application Priority Data

Aug. 28, 1995 [JP] Japan .................................. 7-219020

[51] Int. Cl.⁶ .............................. H03B 5/12; H03H 11/00
[52] U.S. Cl. .................................. 331/117 R; 331/117 R; 333/214
[58] Field of Search .......................... 331/116 R, 116 FE, 331/117 R, 117 FE, 158, 168, 177 R, 177 V; 333/214; 327/553

[56] References Cited

U.S. PATENT DOCUMENTS 4,553,107  11/1985  Ogawa ..................................... 330/288
5,030,927   7/1991  Itoh ..................................... 333/214 X

*Primary Examiner*—David Mis
*Attorney, Agent, or Firm*—Oblon, Spivak, McClelland, Maier & Neustadt, P.C.

[57] ABSTRACT

A variable-reactance circuit comprising an amplifying section, a first differential section and a second differential section. The amplifying section has first to third bipolar transistors. These transistors are driven by three constant-current sources, respectively. The first differential section receives an output signal of the amplifying section. The first differential section has fourth and fifth bipolar transistors, which are driven by a first variable-current source. The second differential section receives the output signal of the amplifying section. The second differential section has sixth and seventh bipolar transistors, which are driven by a second variable-current source. The output currents of the first and second variable-current sources are controlled by two control signals, respectively.

17 Claims, 6 Drawing Sheets

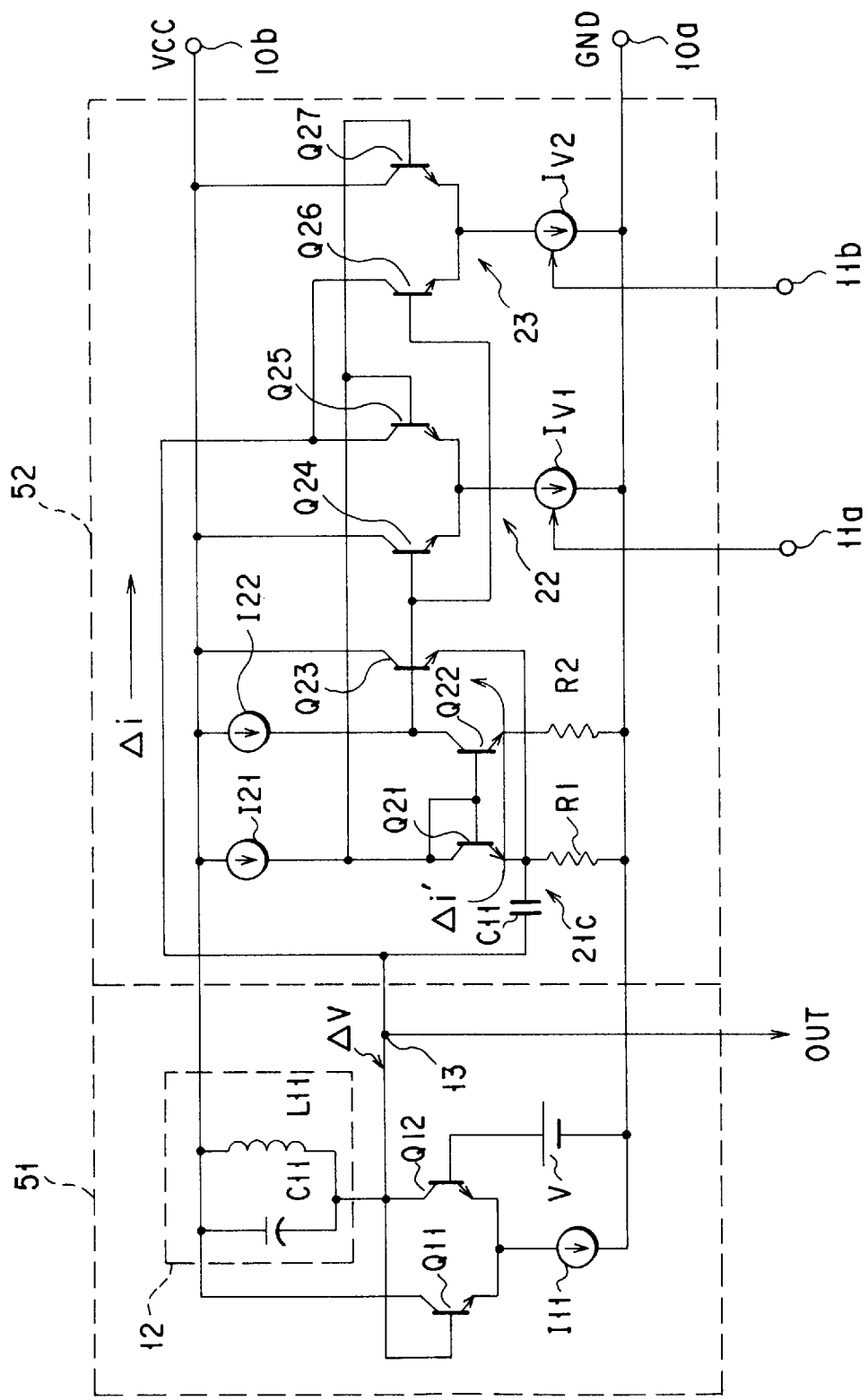
F I G. 5

1

VARIABLE-REACTANCE CIRCUIT

BACKGROUND OF THE INVENTION

1. Field of the Invention

The present invention relates to a variable-reactance circuit which comprises bipolar transistors.

2. Description of the Related Art

FIG. 1 shows a conventional VCO (Voltage-Controlled Oscillator), which is disclosed in Jpn. Pat. Appln. KOKAI Publication No. 6-303089, laid open Oct. 28, 1994.

As shown in FIG. 1, the VCO has an oscillator 51 and a variable-reactance circuit 52. The oscillator 51 comprises npn bipolar transistors Q11 and Q12, a constant-current source I11, a reference-voltage source V and a resonator 12. The components of the oscillator 51 are connected as will be indicated below.

The constant-current source I11 is connected between the emitter node of the transistors Q11 and Q12 and a power-supply terminal 10a. A low potential, e.g., the ground potential GND, is applied to the power-supply terminal 10a. The collector of the transistor Q11 is connected to a power-supply terminal 10b, to which a high potential VCC is applied. The base of the transistor Q11 is connected to the collector of the transistor Q12. The reference-voltage source V is connected between the base of the transistor Q12 and the power-supply terminal 10a. The resonator 12 is connected between the collector of the transistor Q12 and the power-supply terminal 10b. Through the collector of the transistor Q12 there is supplied the output signal OUT of the VCO is supplied.

The variable-reactance circuit 52 comprises npn bipolar transistors Q1 to Q6, constant-current sources I1 and I2, a capacitor C1, diodes D1 and D2 and variable-current sources Iv1 and Iv2. The components of the oscillator 51 are connected as will be described below.

The constant-current source I1 is connected between the emitter of the transistor Q1 and the power-supply terminal 10a, and the diode D1 between the collector of the transistor Q1 and the power-supply terminal 10b. The constant-current source I2 is connected between the emitter of the transistor Q2 and the power-supply terminal 10a, and the diode D2 between the collector of the transistor Q2 and the power-supply terminal 10b. The capacitor C1 is connected between the emitter of the transistor Q1 and the emitter of the transistor Q2.

The variable-current source Iv1 is connected between the emitter node of the transistors Q3 and Q4 and the power-supply terminal 10a. The output current of the variable-current source Iv1 is controlled by a control signal supplied to a control terminal 11a. The variable-current source Iv2 is connected between the emitter node of the transistors Q5 and Q6 and the power-supply terminal 10a. The output current of the variable-current source Iv1 is controlled by a control signal supplied to a control terminal 11b.

The base of the transistors Q3 is connected the collector of the transistor Q1 and the base of the transistor Q2. So is the base of the transistor Q6. The bases of the transistors Q4 and Q5 are connected to the collector of the transistor Q2. The collectors of the transistors Q3 and Q5 are connected to the power-supply terminal 10b. The collectors of the transistors Q4 and Q6 are connected to the base of the transistor Q1. The base of the transistor Q1 is connected to the collector of the transistor Q12 of the oscillator 51.

The reactance as viewed from the output terminal 13 of the VCO varies with the value of the control signals applied to the control terminals 11a and 11b, i.e., the values of the currents supplied from the variable-current sources Iv1 and Iv2. Hence, the control signals applied to the control terminals 11a and 11b change the frequency of the signal OUT generated by the VCO.

In the VCO described above, the variable-reactance circuit 52 can operate when the voltage applied between the power-supply terminals 10a and 10b is equal to or higher than the sum of the voltage (about 0.7 V) applied between the base of the transistor Q3 and the emitter of the transistor Q5 and the forward voltage drop (about 0.7 V) at the diode D1. However, the voltage applied to the system (LSI) including the VCO is too low. Therefore, the power-supply potential VCC, i.e., the power-supply voltage, needs to be 1 V or less if the ground potential GND is applied to the power-supply terminal 10a.

SUMMARY OF THE INVENTION

The present invention has been made in view of the foregoing. The object of the invention is to provide a variable-reactance circuit which can operate correctly even if the power-supply potential is equal to or less than 1 V.

To achieve the object, a variable-reactance circuit according to this invention comprises: a first bipolar transistor having a base, an emitter connected to a first power-supply terminal by a first resistor, and collector connected to the base and also to a second power-supply terminal by a first constant-current source; a second bipolar transistor having an emitter connected to the first power-supply terminal by a second resistor, a base connected to the base of the first bipolar transistor, and a collector connected to the second power-supply terminal by a second constant-current source; a third bipolar transistor having an emitter connected to the emitter of the first bipolar transistor, a base connected to the collector of the second bipolar transistor, and a collector connected to the second power-supply terminal by a third constant-current source and also to the second power-supply terminal by a third resistor and a fourth constant-current source; a diode having a cathode connected to the first power-supply terminal by a fourth resistor and an anode connected to the fourth constant-current source; a fourth bipolar transistor having an emitter connected to the first power-supply terminal by a first variable-current source, a base connected to the collector of the third bipolar transistor, and a collector connected to the second power-supply terminal; a fifth bipolar transistor having an emitter connected to the first power-supply terminal by the first variable-current source, a base connected to the collector of the first bipolar transistor, and a collector which is to be connected to an output node of an oscillator; a sixth bipolar transistor having an emitter connected to the first power-supply terminal by a second variable-current source, a base connected to the collector of the third bipolar transistor, and a collector connected to the output node of the oscillator; a seventh bipolar transistor having an emitter connected to the first power-supply terminal by the second variable-current source, a base connected to the collector of the first bipolar transistor, and a collector connected to the second power-supply terminal; and a capacitor connected at one end to the emitter of the first bipolar transistor and connected at the other end to the output node of the oscillator.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a circuit diagram of a VCO incorporating a variable-reactance circuit according to a fourth embodiment of the present invention.

DETAILED DESCRIPTION OF THE PREFERRED EMBODIMENTS

Variable reactance circuits according to this invention will be described in detail, with reference to the accompanying drawings.

Figure 1:
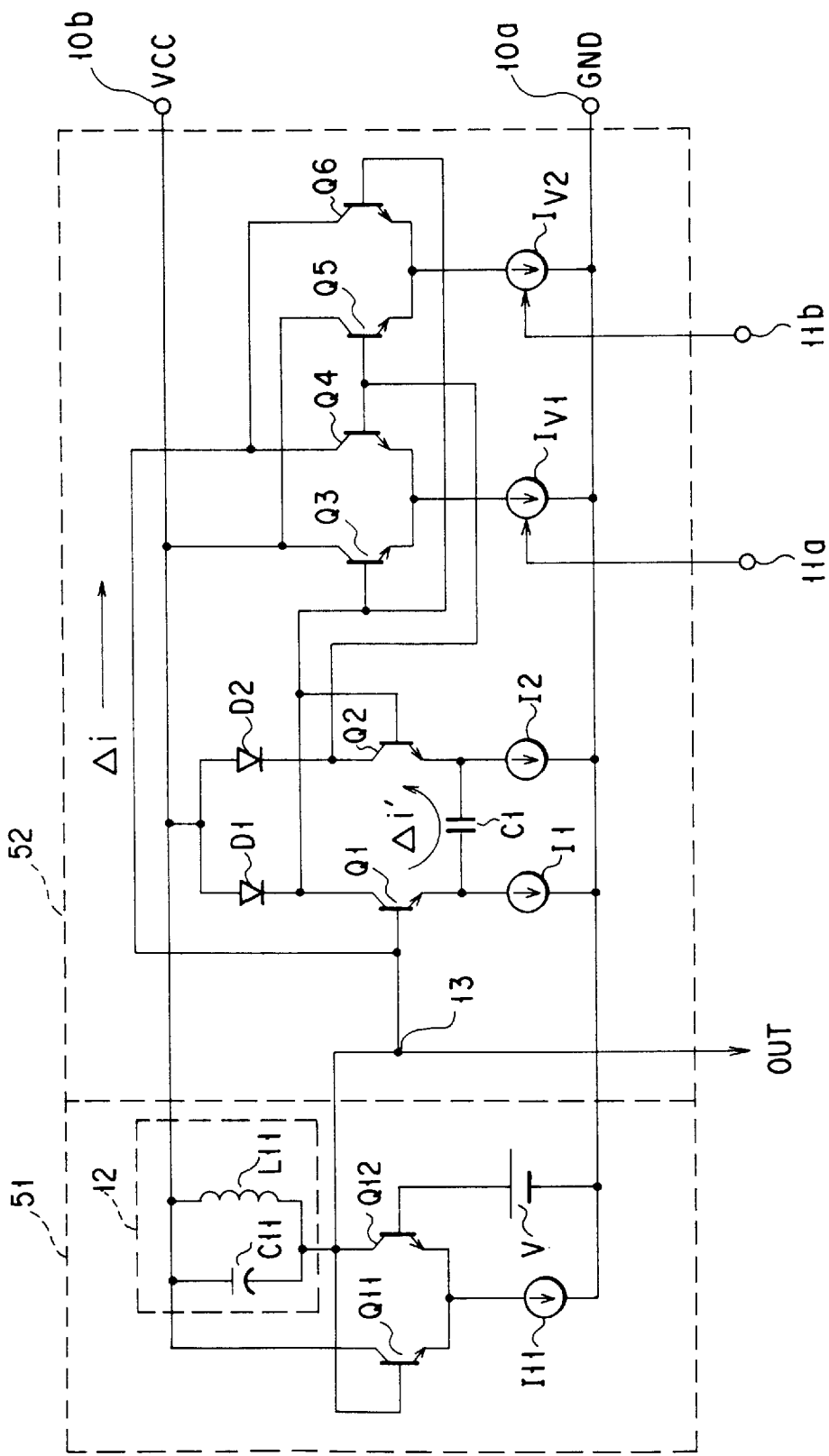
FIG. 1 is a circuit diagram of a VCO incorporating a conventional variable-reactance circuit.
Figure 2:
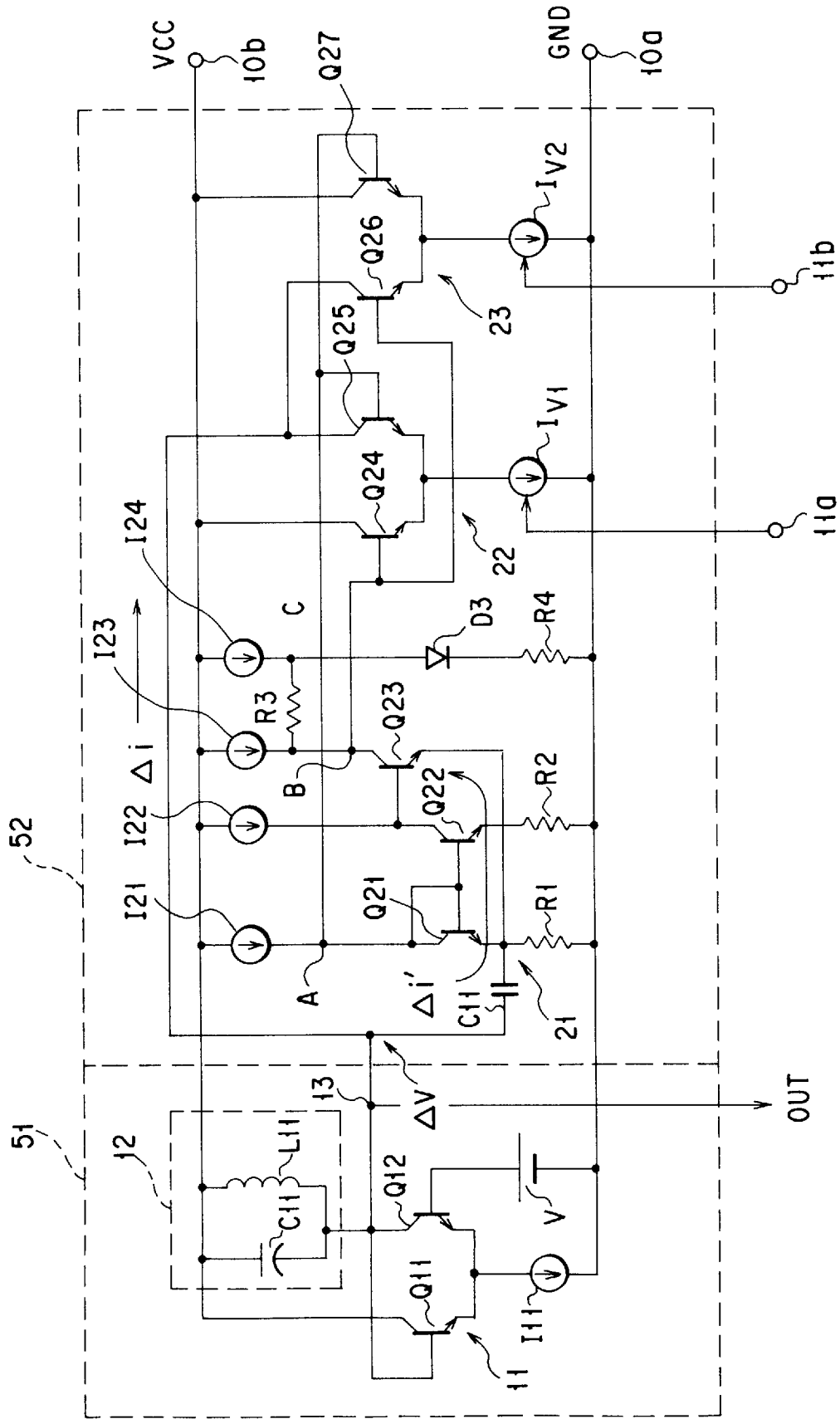
FIG. 2 is a circuit diagram of a VCO incorporating a variable-reactance circuit according to a first embodiment of the present invention.

FIG. 2 shows a VCO which incorporates a variable-reactance circuit according to the first embodiment of the invention. As seen from FIG. 2, the VCO has an oscillator 51 and a variable-reactance circuit 52.

The oscillator 51 comprises npn bipolar transistors Q11 and Q12, a constant-current source I11, a reference-voltage source V, and a resonator 12. The components of the oscillator 51 are connected as will be described below.

The constant-current source I11 is connected between the emitter node of the transistors Q11 and Q12 and a power-supply terminal 10a. A low potential, for example the ground potential GND, is applied to the power-supply terminal 10a. The collector of the transistor Q11 is connected to a power-supply terminal 10b, to which a high potential VCC is applied. The base of the transistor Q11 is connected to the collector of the transistor Q12. The reference-voltage source V is connected between the base of the transistor Q12 and the power-supply terminal 10a. The resonator 12 is connected between the collector of the transistor Q12 and the power-supply terminal 10b. Through the collector of the transistor Q12 there is supplied the output signal OUT of the VCO is supplied.

The variable-reactance circuit 52 comprises a capacitor C11, an amplifying section 21, and differential sections 22 and 23. The amplifying section 21 comprises npn bipolar transistors Q21 to Q23, constant-current sources I21 to I24, resistors R1 to R4, and a diode D3. The first differential section 22 comprises npn bipolar transistors Q24 and Q25 and a variable-current source Iv1. The second differential section 23 comprises npn bipolar transistors Q26 and Q27 and a variable-current source Iv2.

The components of the variable-reactance circuit 52 are connected as will be indicated below.

The resistor R1 is connected between the emitter of the transistor Q21 and the power-supply terminal 10a. The constant-current source I21 is connected between the collector of the transistor Q21 and the power-supply terminal 10b. The base and collector of the transistor Q21 are connected to each other. The resistor R2 is connected between the emitter of the transistor Q22 and the power-supply terminal 10a. The constant-current I22 is connected between the collector of the transistor Q22 and the power-supply terminal 10b. The bases of the transistors Q21 and Q22 are connected to each other.

The constant-current source I23 is connected between the collector of the transistor Q23 and the power-supply terminal 10b. The base of the transistor Q23 is connected to the collector of the transistor Q22. The emitter of the transistor Q23 is connected to the emitter of the transistor Q21. The resistor R4 is connected to the power-supply terminal 10a, and the constant-current source I24 to the power-supply terminal 10b. The diode D3 is connected between the constant-current source I24 and the resistor R4. The diode D3 is composed of, for example, an npn bipolar transistor whose collector and base are connected together. The resistor R3 is connected between the collector of the transistor Q23 and the node C of the constant-current source I24 and the diode D3.

The variable-current source Iv1 is connected between the emitter node of the transistors Q24 and Q25 and the power-supply terminal 10a. The output current of the variable-current source Iv1 is controlled by a control signal supplied to a control terminal 11a. The variable-current source Iv2 is connected between the emitter node of the transistors Q26 and Q27 and the power-supply terminal 10a. The output current of the variable-current source Iv2 is controlled by a control signal supplied to a control terminal 11b.

The bases of the transistors Q24 and Q26 are connected to the collector (i.e., node B) of the transistor Q23. The bases of the transistors Q25 and Q27 are connected to the collector (i.e., node A) of the transistor Q21. The collectors of the transistors Q24 and Q27 are connected to the power-supply terminal 10b. The collectors of the transistors Q25 and Q26 are connected to the emitter of the transistor Q21 by the capacitor C11. The collectors of the transistors Q25 and Q26 are connected to the collector of the transistor Q12 incorporated in the oscillator 51. (The collector of the transistor Q12 serves as the output node 13 of the VCO.)

The reactance as viewed from the output node 13 of the VCO varies with the value of the control signals applied to the control terminals 11a and 11b, i.e., the values of the currents supplied from the variable-current sources Iv1 and Iv2. Hence, the control signals applied to the control terminals 11a and 11b change the frequency of the signal OUT from the VCO.

How the variable-reactance circuit shown in FIG. 2 operates will now be explained.

Assume that $I1=I2=I3=I4=I$ and that $R1:R2:R4=1:2:2$. Here, I1, I2, I3 and I4 are the output currents of the constant-current sources I1, I2, I3 and I4, respectively, and R1, R2, R3 and R4 are the resistances of the resistors R1, R2, R3 and R4, respectively. In this case, a current ($=I1+I3$) flows through the resistor R1, and a current ($=I4$) flows through the resistor R4. Therefore, the voltage drop across the resistor R1 is $(I1+I2) \times R1$ and the voltage drop across the resistor R4 is $I4 \times R4$.

Assuming that the current amplification factors of the transistors Q21 to Q27 are infinitely large, there is the relationship of: (I1+I3)×R1=I4×R4. Since the collector current of the transistor Q21 is equal to the forward current flowing through the diode D3, the potential of the collector (i.e., node A) of the transistor Q21 is equal to the potential of the anode (i.e., node C) of the diode D3.

Assume a signal Δv is supplied to the output node 13 of VCO. Then, the current Δi' flowing through the capacitor C11 is given as:

$$\Delta i' = \Delta v/(1/j\omega C11) \qquad (1)$$
$$= \Delta v \times j\omega C11$$

where C11 is the capacitance of the capacitor C11.

The current Δi' is amplified by the amplifying section 21 and the differential section 23. A current Δi flows toward the collectors of the transistors Q24 and Q26. The magnitude and direction of this current Δi changes, depending on the values of the currents which flow through the variable-current sources Iv1 and Iv2.

The relationship between currents Δi' and Δi can be expressed as follows:

$$\Delta i/\Delta i' = \pm Ai \qquad (2)$$

where Ai is the current gain of the variable-reactance circuit 52. The current gain Ai can be minutely adjusted by changing the resistance of the resistor R4.

The input impedance Zin of the variable-reactance circuit 52 is represented by:

$$Zin = \Delta v/\Delta i \qquad (3)$$
$$= \pm(1/j\omega C11Ai)$$

As can be understood from the equation (3), the reactance as viewed from the output node 13 changes as the input impedance Zin of the circuit 52 varies, depending upon the output currents of the variable-current sources Iv1 and Iv2. The frequency of the signal OUT from the VCO therefore changes in accordance with the control signals supplied to the control terminals 11a and 11b.

The variable-reactance circuit 52 can operate, provided that the power-supply voltage is equal to or higher than the voltage (about 0.7 V) between the base of the transistor Q24 and the emitter of the transistor Q26. In other words, the circuit 52 operates if a potential of 0.7 or more is applied to the power-supply terminal 10b while the ground potential GND is applied to the power-supply terminal 10a. Namely, the variable-reactance circuit 52 can reliably operate at a power-supply voltage of about 1 V.

Figure 3:
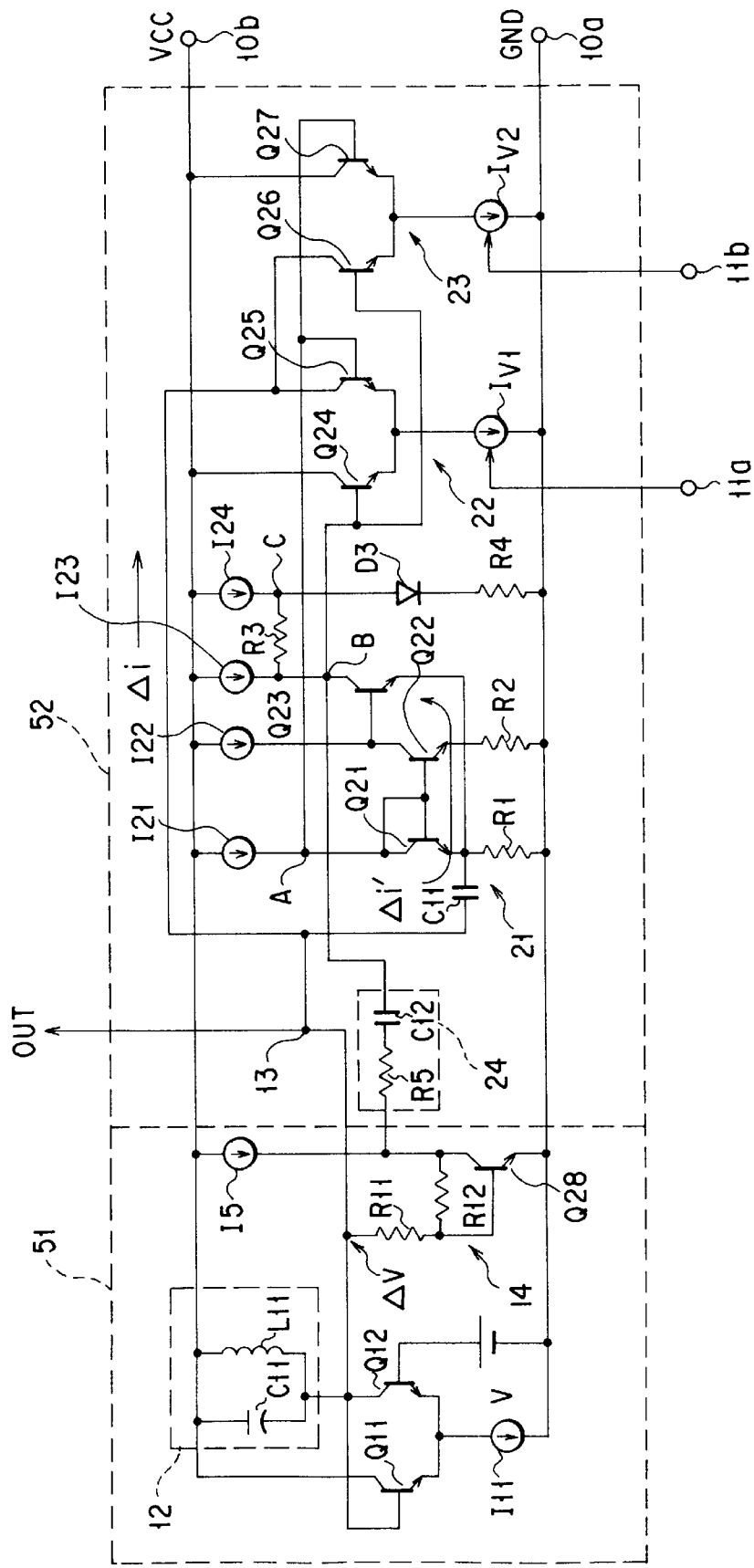
FIG. 3 is a circuit diagram of a VCO incorporating a variable-reactance circuit according to a second embodiment of the invention.

FIG. 3 illustrates a VCO incorporating a variable-reactance circuit according to the second embodiment of the invention. As shown in FIG. 3, this VCO has an oscillator 51 and a variable-reactance circuit 52, too.

The oscillator 51 comprises npn bipolar transistors Q11 and Q12, a constant-current source I11, a reference-voltage source V, a resonator 12, and an inverter 14. The inverter 14 comprises an npn bipolar transistor Q28, resistors R11 and R12 and a constant-current source 15.

The components of the oscillator 51 are connected as will be described below.

The constant-current source I11 is connected between the emitter node of the transistors Q11 and Q12 and a power-supply terminal 10a. A low potential, for example the ground potential GND, is applied to the power-supply terminal 10a. The collector of the transistor Q11 is connected to a power-supply terminal 10b, to which a high potential VCC is applied. The base of the transistor Q11 is connected to the collector of the transistor Q12. The reference-voltage source V is connected between the base of the transistor Q12 and the power-supply terminal 10a. The resonator 12 is connected between the collector of the transistor Q12 and the power-supply terminal 10b. The emitter of the transistor Q28 is connected to the power-supply terminal 10a. The constant-current source 15 is connected between the collector of the transistor Q28 and the power-supply terminal 10b. The resistor R11 is connected between the base of the transistor Q28 and the collector of the transistor Q12. The resistor R12 is connected between the base and collector of the transistor Q28. Through the collector of the transistor Q12 there is supplied the output signal OUT of the VCO is supplied.

The variable-reactance circuit 52 comprises a capacitor C11, an amplifying section 21, differential sections 22 and 23, and a signal-supplying section 24. The amplifying section 21 comprises npn bipolar transistors Q21 to Q23, constant-current sources I21 to I24, resistors R1 to R4, and a diode D3. The first differential section 22 comprises npn bipolar transistors Q24 and Q25 and a variable-current source Iv1. The second differential section 23 comprises npn bipolar transistors Q26 and Q27 and a variable-current source Iv2. The signal-supplying section 24 comprises a resistor R5 and a capacitor C12.

The components of the variable-reactance circuit 52 are connected as will be indicated below.

The resistor R1 is connected between the emitter of the transistor Q21 and the power-supply terminal 10a. The constant-current source I21 is connected between the collector of the transistor Q21 and the power-supply terminal 10b. The base and collector of the transistor Q21 are connected to each other. The resistor R2 is connected between the emitter of the transistor Q22 and the power-supply terminal 10a. The constant-current I22 is connected between the collector of the transistor Q22 and the power-supply terminal 10b. The bases of the transistors Q21 and Q22 are connected to each other.

The constant-current source I23 is connected between the collector of the transistor Q23 and the power-supply terminal 10b. The base of the transistor Q23 is connected to the collector of the transistor Q22. The emitter of the transistor Q23 is connected to the emitter of the transistor Q21. The resistor R4 is connected to the power-supply terminal 10a, and the constant-current source I24 to the power-supply terminal 10b. The diode D3 is connected between the constant-current source I24 and the resistor R4. The diode D3 is composed of, for example, an npn bipolar transistor whose collector and base are connected together. The resistor R3 is connected between the collector of the transistor Q23 and the node C of the constant-current source I24 and the diode D3.

The variable-current source Iv1 is connected between the emitter node of the transistors Q24 and Q25 and the power-supply terminal 10a. The output current of the variable-current source Iv1 is controlled by a control signal supplied to a control terminal 11a. The variable-current source Iv2 is connected between the emitter node of the transistors Q26 and Q27 and the power-supply terminal 10a. The output current of the variable-current source Iv2 is controlled by a control signal supplied to a control terminal 11b.

The bases of the transistors Q24 and Q26 are connected to the collector (i.e., node B) of the transistor Q23. The bases of the transistors Q25 and Q27 are connected to the collector (i.e., node A) of the transistor Q21. The collectors of the transistors Q24 and Q27 are connected to the power-supply terminal 10b. The collectors of the transistors Q25 and Q26 are connected to the emitter of the transistor Q21 by the capacitor C11. The collectors of the transistors Q25 and Q26 are connected to the collector of the transistor Q12 incorporated in the oscillator 51. (The collector of the transistor Q12 serves as the output node 13 of the VCO.)

The reactance as viewed from the output node 13 of the VCO varies with the value of the control signals applied to the control terminals 11a and 11b, i.e., the values of the currents supplied from the variable-current sources Iv1 and Iv2. Hence, the control signals applied to the control terminals 11a and 11b change the frequency of the signal OUT from the VCO.

Assume that I1=I2=I3=I4=I and that R1:R2:R4=1:2:2. Here, I1, I2, I3 and I4 are the output currents of the constant-current sources I1, I2, I3 and I4, respectively, and R1, R2, R3 and R4 are the resistances of the resistors R1, R2, R3 and R4, respectively. Then, the reactance of the output node 13 of the VCO can change on the basis of the control signals supplied to the control terminals 11a and 11b.

The variable-reactance circuit 52 can operate, provided that the power-supply voltage is equal to or higher than the voltage (about 0.7 V) between the base of the transistor Q24 and the emitter of the transistor Q26. In other words, the circuit 52 operates if a potential of 0.7 or more is applied to the power-supply terminal 10b while the ground potential GND is applied to the power-supply terminal 10a. Thus, the variable-reactance circuit 52 can reliably operate at a power-supply voltage of about 1 V.

Figure 4:
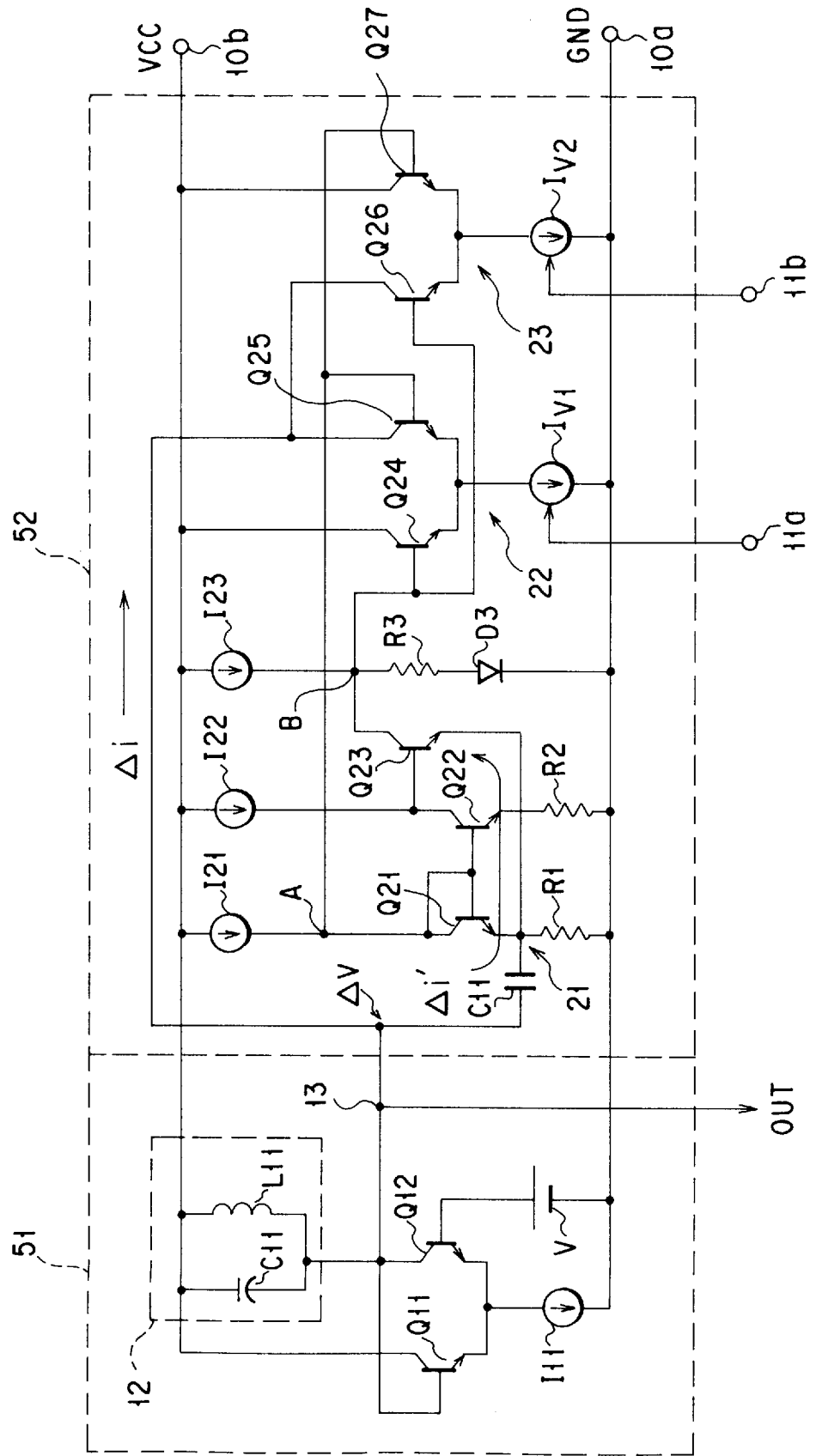
FIG. 4 is a circuit diagram of a VCO incorporating a variable-reactance circuit according to a third embodiment of this invention.

FIG. 4 shows a VCO incorporating a variable-reactance circuit according to the third embodiment of the invention. As seen from FIG. 4, this VCO has an oscillator 51 and a variable-reactance circuit 52, too.

The oscillator 51 comprises npn bipolar transistors Q11 and Q12, a constant-current source I11, a reference-voltage source V, and a resonator 12. The components of the oscillator 51 are connected as will be indicated below.

The constant-current source I11 is connected between the emitter node of the transistors Q11 and Q12 and a power-supply terminal 10a. A low potential, for example the ground potential GND, is applied to the power-supply terminal 10a. The collector of the transistor Q11 is connected to a power-supply terminal 10b, to which a high potential VCC is applied. The base of the transistor Q11 is connected to the collector of the transistor Q12. The reference-voltage source V is connected between the base of the transistor Q12 and the power-supply terminal 10a. The resonator 12 is connected between the collector of the transistor Q12 and the power-supply terminal 10b. Through the collector of the transistor Q12 there is supplied the output signal OUT of the VCO is supplied.

The variable-reactance circuit 52 comprises a capacitor C11, an amplifying section 21, and differential sections 22 and 23. The amplifying section 21 comprises npn bipolar transistors Q21 to Q23, constant-current sources I21 to I23, resistors R1 to R3, and a diode D3. The first differential section 22 comprises npn bipolar transistors Q24 and Q25 and a variable-current source Iv1. The second differential section 23 comprises npn bipolar transistors Q26 and Q27 and a variable-current source Iv2.

The components of the variable-reactance circuit 52 are connected as will be described below.

The resistor R1 is connected between the emitter of the transistor Q21 and the power-supply terminal 10a. The constant-current source I21 is connected between the collector of the transistor Q21 and the power-supply terminal 10b. The base and collector of the transistor Q21 are connected to each other. The resistor R2 is connected between the emitter of the transistor Q22 and the power-supply terminal 10a. The constant-current I22 is connected between the collector of the transistor Q22 and the power-supply terminal 10b. The bases of the transistors Q21 and Q22 are connected to each other.

The constant-current source I23 is connected between the collector of the transistor Q23 and the power-supply terminal 10b. The base of the transistor Q23 is connected to the collector of the transistor Q22. The emitter of the transistor Q23 is connected to the emitter of the transistor Q21. The diode D3 and the resistor R3 are connected in series between the constant-current source I23 and the power-supply terminal 10a. The diode D3 is composed of, for example, an npn bipolar transistor whose collector and base are connected together.

The output currents of the constant-current sources I21, I22 and I23 have the relationship of: I21:I22:I23=1:1:2. The resistances of the resistors R1, R2 and R3 have the relationship of: R1:R2:R3=1:2:2. Here, I21, I22 and I23 are the output currents of the sources I21, I22 and I23, respectively, and R1, R2 and R3 are the resistances of the resistors R1, R2 and R3, respectively.

The variable-current source Iv1 is connected between the emitter node of the transistors Q24 and Q25 and the power-supply terminal 10a. The output current of the variable-current source Iv1 is controlled by a control signal supplied to a control terminal 11a. The variable-current source Iv2 is connected between the emitter node of the transistors Q26 and Q27 and the power-supply terminal 10a. The output current of the variable-current source Iv2 is controlled by a control signal supplied to a control terminal 11b.

The bases of the transistors Q24 and Q26 are connected to the collector (i.e., node B) of the transistor Q23. The bases of the transistors Q25 and Q27 are connected to the collector (i.e., node A) of the transistor Q21. The collectors of the transistors Q24 and Q27 are connected to the power-supply terminal 10b. The collectors of the transistors Q25 and Q26 are connected to the emitter of the transistor Q21 by the capacitor C11. The collectors of the transistors Q25 and Q26 are connected to the collector of the transistor Q12 incorporated in the oscillator 51. (The collector of the transistor Q12 serves as the output node 13 of the VCO.)

The reactance as viewed from the output node 13 of the VCO varies with the value of the control signals applied to the control terminals 11a and 11b, i.e., the values of the currents supplied from the variable-current sources Iv1 and Iv2. The control signals applied to the control terminals 11a and 11b therefore change the frequency of the signal OUT from the VCO.

In the variable-reactance circuit of FIG. 4, a current {=I21+(I23/2)} flows through the resistor R1. Therefore, the voltage drop across the resistor R1 is {I21+(I23/2)}×R1. The output current of the constant-current source I23 is divided into two parts. The first part of the current flows to the transistor Q23, while the second part of the current flows to the resistor R3 and the diode D3. More precisely, a current of I23/2 flows to the resistor R3. Thus, the voltage drop at the resistor R3 is (I23/2)×R3. This voltage drop determines the bias voltage which is applied to the collector of the transistor Q23.

Assuming that the current amplification factors of the transistors Q21 to Q27 are infinitely large, the potentials at the nodes A and B are equal.

The third embodiment (FIG. 4) has neither the resistor R4 nor the constant-current source I24. Made of less components, the third embodiment serves to reduce the size of a semiconductor chip in which it is formed, and occupies but a relatively small area in the element region of a semiconductor chip.

FIG. 5 illustrates a VCO incorporating a variable-reactance circuit according to the fourth embodiment of the present invention. As shown in FIG. 5, the VCO has an oscillator 51 and a variable-reactance circuit 52, too.

The oscillator 51 comprises npn bipolar transistors Q11 and Q12, a constant-current source I11, a reference-voltage source V, and a resonator 12. The components of the oscillator 51 are connected as will be indicated below.

The constant-current source I11 is connected between the emitter node of the transistors Q11 and Q12 and a power-supply terminal 10a. A low potential, for example the ground potential GND, is applied to the power-supply terminal 10a. The collector of the transistor Q11 is connected to a power-supply terminal 10b, to which a high potential VCC is applied. The base of the transistor Q11 is connected to the collector of the transistor Q12. The reference-voltage source V is connected between the base of the transistor Q12 and the power-supply terminal 10a. The resonator 12 is connected between the collector of the transistor Q12 and the power-supply terminal 10b. Through the collector of the transistor Q12 there is supplied the output signal OUT of the VCO is supplied.

The variable-reactance circuit 52 comprises a capacitor C11, an amplifying section 21, and differential sections 22 and 23. The amplifying section 21 comprises npn bipolar transistors Q21 to Q23, constant-current sources I21 and I22, and resistors R1 and R2. The first differential section 22 comprises npn bipolar transistors Q24 and Q25 and a variable-current source Iv1. The second differential section 23 comprises npn bipolar transistors Q26 and Q27 and a variable-current source Iv2.

The components of the variable-reactance circuit 52 are connected as will be described below.

The resistor R1 is connected between the emitter of the transistor Q21 and the power-supply terminal 10a. The constant-current source I21 is connected between the collector of the transistor Q21 and the power-supply terminal 10b. The base and collector of the transistor Q21 are connected to each other. The resistor R2 is connected between the emitter of the transistor Q22 and the power-supply terminal 10a. The constant-current source I22 is connected between the collector of the transistor Q22 and the power-supply terminal 10b. The bases of the transistors Q21 and Q22 are connected to each other.

The collector and base of the transistor Q23 are connected to the power-supply terminal 10b and the collector of the transistor Q22, respectively. The emitter of the transistor Q23 is connected to the emitter of the transistor Q21.

The variable-current source Iv1 is connected between the emitter node of the transistors Q24 and Q25 and the power-supply terminal 10a. The output current of the variable-current source Iv1 is controlled by a control signal supplied to a control terminal 11a. The variable-current source Iv2 is connected between the emitter node of the transistors Q26 and Q27 and the power-supply terminal 10a. The output current of the variable-current source Iv2 is controlled by a control signal supplied to a control terminal 11b.

The bases of the transistors Q24 and Q26 are connected to the collector of the transistor Q23. The bases of the transistors Q25 and Q27 are connected to the collector of the transistor Q21. The collectors of the transistors Q24 and Q27 are connected to the power-supply terminal 10b. The collectors of the transistors Q25 and Q26 are connected to the emitter of the transistor Q21 by the capacitor C11. The collectors of the transistors Q25 and Q26 are connected to the collector of the transistor Q12 incorporated in the oscillator 51. (The collector of the transistor Q12 serves as the output node 13 of the VCO.)

The reactance as viewed from the output node 13 of the VCO varies with the value of the control signals applied to the control terminals 11a and 11b, i.e., the values of the currents supplied from the variable-current sources Iv1 and Iv2. The control signals applied to the control terminals 11a and 11b therefore change the frequency of the signal OUT from the VCO.

Therefore, the reactance of the output node of the VCO can change in accordance with the control signals supplied to the control terminals 11a and 11b, and the power-supply voltage can be reduced to 1 V or less.

The fourth embodiment (FIG. 5) differs from the first embodiment (FIG. 2) in that there are provided no components which correspond to the resistors R3 and R4, the diode D3 and the constant-current sources I23 and I24. Made of less components, the fourth embodiment serves to reduce the size of a semiconductor chip in which it is formed, and occupies but a relatively small area in the element region of a semiconductor chip.

Figure 6:
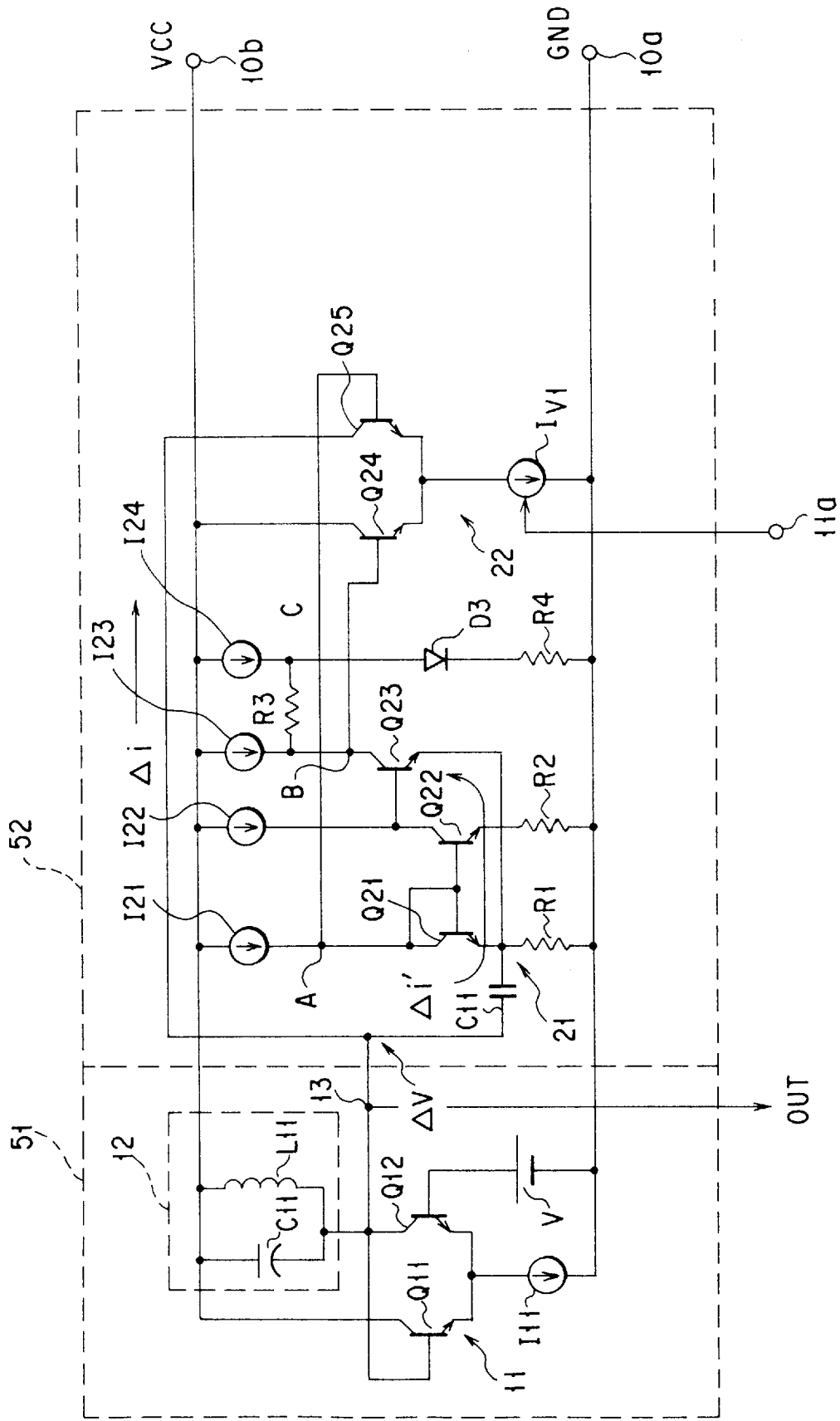
FIG. 6 is a circuit diagram of a VCO incorporating a variable-reactance circuit according to a fifth embodiment of the present invention.

FIG. 6 shows a VCO which incorporates a variable-reactance circuit according to the fifth embodiment of the invention. As seen from FIG. 6, the VCO has an oscillator 51 and a variable-reactance circuit 52.

The oscillator 51 comprises npn bipolar transistors Q11 and Q12, a constant-current source I11, a reference-voltage source V, and a resonator 12. The components of the oscillator 51 are connected as will be described below.

The constant-current source I11 is connected between the emitter node of the transistors Q11 and Q12 and a power-supply terminal 10a. A low potential, for example the ground potential GND, is applied to the power-supply terminal 10a. The collector of the transistor Q11 is connected to a power-supply terminal 10b, to which a high potential VCC is applied. The base of the transistor Q11 is connected to the collector of the transistor Q12. The reference-voltage source V is connected between the base of the transistor Q12 and the power-supply terminal 10a. The resonator 12 is connected between the collector of the transistor Q12 and the power-supply terminal 10b. Through the collector of the transistor Q12 there is supplied the output signal OUT of the VCO is supplied.

The variable-reactance circuit 52 comprises a capacitor C11, an amplifying section 21, and differential section 22. The amplifying section 21 comprises npn bipolar transistors Q21 to Q23, constant-current sources I21 to I24, resistors R1 to R4, and a diode D3. The differential section 22 comprises npn bipolar transistors Q24 and Q25 and a variable-current source Iv1.

The components of the variable-reactance circuit 52 are connected as will be indicated below.

The resistor R1 is connected between the emitter of the transistor Q21 and the power-supply terminal 10a. The constant-current source I21 is connected between the collector of the transistor Q21 and the power-supply terminal 10b. The base and collector of the transistor Q21 are connected to each other. The resistor R2 is connected between the emitter of the transistor Q22 and the power-supply terminal 10a. The constant-current source I22 is connected between the collector of the transistor Q22 and the power-supply terminal 10b. The bases of the transistors Q21 and Q22 are connected to each other.

The constant-current source I23 is connected between the collector of the transistor Q23 and the power-supply terminal 10b. The base of the transistor Q23 is connected to the collector of the transistor Q22. The emitter of the transistor Q23 is connected to the emitter of the transistor Q21. The resistor R4 is connected to the power-supply terminal 10a, and the constant-current source I24 to the power-supply terminal 10b. The diode D3 is connected between the constant-current source I24 and the resistor R4. The diode D3 is composed of, for example, an npn bipolar transistor whose collector and base are connected together. The resistor R3 is connected between the collector of the transistor Q23 and the node C of the constant-current source I24 and the diode D3.

The variable-current source Iv1 is connected between the emitter node of the transistors Q24 and Q25 and the power-supply terminal 10a. The output current of the variable-current source Iv1 is controlled by a control signal supplied to a control terminal 11a.

The bases of the transistor Q24 is connected to the collector (i.e., node B) of the transistor Q23. The bases of the transistor Q25 is connected to the collector (i.e., node A) of the transistor Q21. The collectors of the transistor Q24 is connected to the power-supply terminal 10b. The collectors of the transistor Q25 is connected to the emitter of the transistor Q21 by the capacitor C11. The collectors of the transistor Q25 is connected to the collector of the transistor Q12 incorporated in the oscillator 51. (The collector of the transistor Q12 serves as the output node 13 of the VCO.)

The reactance as viewed from the output node 13 of the VCO varies with the value of the control signals applied to the control terminals 11a and 11b, i.e., the values of the currents supplied from the variable-current source Iv1. Hence, the control signals applied to the control terminal 11a change the frequency of the signal OUT from the VCO.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A variable-reactance circuit comprising:
   a first bipolar transistor having a base, an emitter connected to a first power-supply terminal by a first resistor, and collector connected to the base and also to a second power-supply terminal by a first constant-current source;
   a second bipolar transistor having an emitter connected to said first power-supply terminal by a second resistor, a base connected to the base of said first bipolar transistor, and a collector connected to said second power-supply terminal by a second constant-current source;
   a third bipolar transistor having an emitter connected to the emitter of said first bipolar transistor, a base connected to the collector of said second bipolar transistor, and a collector connected to a bias means;
   a differential section having at least one bipolar transistor pair, said bipolar transistor pair including a fourth bipolar transistor having a base connected to the collector of the third transistor, and a fifth bipolar transistor having a base connected to the collector of the first transistor, one of the transistors of said bipolar transistor pair having a collector connected to an oscillator, the transistors of said bipolar transistor pair having an emitter connected to the first power-supply terminal through a variable-current source; and
   a capacitor connected between the emitter of said first bipolar transistor and the output node of the oscillator.

2. The circuit according to claim 1, wherein said bias means includes a diode having a cathode connected to the first power-supply terminal through a resistor, and an anode connected to a constant-current source.

3. A circuit according to claim 1, wherein said bias means includes a diode having a cathode connected to the first power-supply terminal, and an anode connected to the second power-supply terminal through both a resistor and a constant current source.

4. A voltage controlled oscillator comprising:
   an oscillator having a first node connected to receive a first output signal and a second output node connected to receive a second output signal obtained by inverting the first output signal;
   a first bipolar transistor having a base, an emitter connected to a first power-supply terminal by a first resistor, and collector connected to the base and also to a second power-supply terminal by a first constant-current source;
   a second bipolar transistor having an emitter connected to said first power-supply terminal by a second resistor, a base connected to the base of said first bipolar transistor, and a collector connected to said second power-supply terminal by a second constant-current source;
   a third bipolar transistor having an emitter connected to the emitter of said first bipolar transistor, a base connected to the collector of said second bipolar transistor, and a collector connected to said second power-supply terminal by a third constant-current source and also to said second power-supply terminal by a third resistor and a fourth constant-current source;
   a diode having a cathode connected to said first power-supply terminal by a fourth resistor and an anode connected to said fourth constant-current source;
   a fourth bipolar transistor having an emitter connected to said first power-supply terminal by a first variable-current source, a base connected to the collector of said third bipolar transistor, and a collector connected to said second power-supply terminal;
   a fifth bipolar transistor having an emitter connected to said first power-supply terminal by said first variable-current source, a base connected to the collector of said first bipolar transistor, and a collector connected to the first output node of said oscillator;
   a sixth bipolar transistor having an emitter connected to said first power-supply terminal by a second variable-current source, a base connected to the collector of said third bipolar transistor, and a collector connected to the first output node of said oscillator;
   a seventh bipolar transistor having an emitter connected to said first power-supply terminal by said second variable-current source, a base connected to the collector of said first bipolar transistor, and a collector connected to said second power-supply terminal;
   a first capacitor connected between the first output node of said oscillator and the emitter of said first bipolar transistor; and
   a fifth resistor and a second capacitor connected in series between the second output node of said oscillator and the collector of said third bipolar transistor.

5. The circuit according to claim 4, wherein I1=I2=I3=I4, and R1:R2:R4=1:2:2, where I1, I2, I3 and I4 are the output currents of said first, second, third and fourth constant-current sources, respectively, and R1, R2 and R4 are the resistance of said first, second and fourth resistors, respectively.

6. The circuit according to claim 4, wherein an output current of said first variable-current source is controlled by a first control signal, and an output current of said second variable-current source is controlled by a second control signal.

7. The circuit according to claim 4, wherein said first to seventh bipolar transistors are npn bipolar transistors.

8. The circuit according to claim 4, wherein said diode is an npn bipolar transistor whose collector and base are connected to each other.

9. The circuit according to claim 4, wherein said first power-supply terminal is connected to receive the ground potential, and said second power-supply terminal is connected to receive a power-supply potential of at least 0.7 V and less than 1 V.

10. The circuit according to claim 4, wherein said oscillator comprises:

an eighth bipolar transistor having an emitter connected to said first power-supply terminal by a fifth constant-current source, and a collector connected to said second power-supply terminal;

a ninth bipolar transistor having an emitter connected to said first power-supply terminal by said fifth constant-current source, a base connected to receive a reference potential, and a collector connected to the base of said eighth bipolar transistor and also to the first output node of the oscillator;

a resonator connected between the collector of said ninth bipolar transistor and said second power-supply terminal; and an inverter connected between said first output node and said second output node.

11. A voltage controlled oscillator comprising:

a first bipolar transistor having a base, an emitter connected to a first power-supply terminal by a first resistor, and collector connected to the base and also to a second power-supply terminal by a first constant-current source;

a second bipolar transistor having an emitter connected to said first power-supply terminal by a second resistor, a base connected to the base of said first bipolar transistor, and a collector connected to said second power-supply terminal by a second constant-current source;

a third bipolar transistor having an emitter connected to the emitter of said first bipolar transistor, a base connected to the collector of said second bipolar transistor, and a collector connected to said second power-supply terminal;

a fourth bipolar transistor having an emitter connected to said first power-supply terminal by a first variable-current source, a base connected to the collector of said third bipolar transistor and also to the base of said third bipolar transistor, and a collector connected to said second power-supply terminal;

a fifth bipolar transistor having an emitter connected to said first power-supply terminal by said first variable-current source, a base connected to the collector of said first bipolar transistor, and a collector connected to an output node of an oscillator;

a sixth bipolar transistor having an emitter connected to said first power-supply terminal by a second variable-current source, a base connected to the collector of said second bipolar transistor and also to the base of said third bipolar transistor, and a collector connected to the output node of the oscillator;

a seventh bipolar transistor having an emitter connected to said first power-supply terminal by said second variable-current source, a base connected to the collector of said first bipolar transistor, and a collector connected to said second power-supply terminal; and a capacitor connected between the emitter of said first bipolar transistor and the output node of the oscillator.

12. The circuit according to claim 11, wherein I21:I22:I23=1:1:2, and R1:R2:R3=1:2:2, where I21, I22 and I23 are the output currents of said first, second and third constant-current sources, respectively, and R1, R2 and R3 are the resistances of said first, second and third resistors, respectively.

13. The circuit according to claim 11, wherein an output current of said first variable-current source is controlled by a first control signal, and an output current of said second variable-current source is controlled by a second control signal.

14. The circuit according to claim 11, wherein said first to seventh bipolar transistors are npn bipolar transistors.

15. The circuit according to claim 11, wherein said diode is an npn bipolar transistor whose collector and base are connected to each other.

16. The circuit according to claim 11, wherein said first power-supply terminal is connected to receive the ground potential, and said second power-supply terminal is connected to receive a power-supply potential of at least 0.7 V and less than 1 V.

17. The circuit according to claim 11, wherein said voltage controlled oscillator further comprises:

an eighth bipolar transistor having an emitter connected to said first power-supply terminal by a fifth constant-current source, and a collector connected to said second power-supply terminal;

a ninth bipolar transistor having an emitter connected to said first power-supply terminal by said fifth constant-current source, a base connected to receive a reference potential, and a collector connected to the base of said eighth bipolar transistor and also to the output node of the oscillator; and a resonator connected between the collector of said ninth bipolar transistor and said second power-supply terminal.

* * * * *